United States Patent
Imai (10) Patent No.: US 8,344,482 B2
(45) Date of Patent: Jan. 1, 2013

(54) ETCHING APPARATUS AND ETCHING METHOD FOR SUBSTRATE BEVEL

(75) Inventor: Shin-ichi Imai, Osaka (JP)

(73) Assignee: Panasonic Corporation, Osaka (JP)

( * ) Notice: Subject to any disclaimer, the term of this patent is extended or adjusted under 35 U.S.C. 154(b) by 103 days.

(21) Appl. No.: 12/939,684

(22) Filed: Nov. 4, 2010

(65) Prior Publication Data

US 2011/0042007 A1 Feb. 24, 2011

Related U.S. Application Data

(62) Division of application No. 11/790,738, filed on Apr. 27, 2007, now Pat. No. 7,858,053.

(30) Foreign Application Priority Data

Apr. 28, 2006 (JP) .................................. 2006-125936

(51) Int. Cl.
*H01L 21/302* (2006.01)
*H01L 29/06* (2006.01)
*H05H 1/00* (2006.01)
*B44C 1/22* (2006.01)
*C03C 15/00* (2006.01)
*C03C 25/68* (2006.01)
*C23F 1/00* (2006.01)

(52) U.S. Cl. ................. 257/618; 257/E21.218; 427/535; 216/67; 216/71; 438/710

(58) Field of Classification Search .................. 438/710; 427/535; 216/67, 71; 257/618

See application file for complete search history.

(56) References Cited

U.S. PATENT DOCUMENTS

| | | | |
|---|---|---|---|
| 6,004,631 A | 12/1999 | Mori | |
| 6,837,967 B1 * | 1/2005 | Berman et al. | 156/345.3 |
| 7,022,937 B2 | 4/2006 | Okumura et al. | |
| 7,026,173 B2 | 4/2006 | Yamashita et al. | |
| 7,858,053 B2 * | 12/2010 | Imai | 422/186 |
| 2002/0037374 A1 | 3/2002 | Gherardi et al. | |

(Continued)

FOREIGN PATENT DOCUMENTS

JP 5-82478 4/1993

(Continued)

OTHER PUBLICATIONS

Japanese Office Action, with English translation, issued in Japanese Patent Application No. JP 2006-125936, mailed Apr. 11, 2008.

*Primary Examiner* — David Zarneke
(74) *Attorney, Agent, or Firm* — McDermott Will & Emery LLP (57) ABSTRACT

In the bevel etching apparatus relating to the present invention, a substrate is inserted between electrically connected electrodes. A high-frequency power source is connected to the electrodes, and ground potential is applied to a support unit that supports the substrate. Gas (atmosphere) is supplied to the gap between the electrodes and the application of the high-frequency electric power to the electrodes causes the generation of atmospheric-pressure glow discharge between the electrode and the substrate. Bevel etching is performed by rotating the substrate along the circumferential direction in this condition. According to this construction, the bevel etching can be simultaneously performed to the front surface, the rear surface and the side of the substrate without causing any configuration change in the substrate.

6 Claims, 5 Drawing Sheets

| U.S. PATENT DOCUMENTS | | | | FOREIGN PATENT DOCUMENTS | | |
|---|---|---|---|---|---|---|
| 2004/0238488 A1 | 12/2004 | Choi et al. | | JP | 8-279494 | 10/1996 |
| 2005/0173067 A1 | 8/2005 | Lim | | JP | 2002-009059 | 1/2002 |
| 2006/0043483 A1 | 3/2006 | Shaheen et al. | | JP | 2004-253785 | 9/2004 |
| 2007/0068623 A1 | 3/2007 | Kim et al. | | | | |
| 2008/0182412 A1 * | 7/2008 | Bailey III et al. | 438/689 | * cited by examiner | | |

ETCHING APPARATUS AND ETCHING METHOD FOR SUBSTRATE BEVEL

CROSS-REFERENCE TO RELATED APPLICATIONS

The present application is a Divisional of U.S. patent application Ser. No. 11/790,738, filed on Apr. 27, 2007 now U.S. Pat. No. 7,858,053, and claims the benefit of patent application number 2006-125936, filed in Japan on Apr. 28, 2006, the entire contents of each of which is incorporated herein by reference.

BACKGROUND OF THE INVENTION

1. Field of the Invention

The present invention relates to a bevel etching apparatus and a bevel etching method for etching a region at a predetermined distance from an outer edge of substrate.

2. Description of the Related Art

Conventionally, in a manufacturing process for semiconductor devices, a thin film, such as a conductor or an insulator, is formed on the surface of a semiconductor substrate, on which pattern transfer is performed. At this time, when the pattern transfer is performed even to a substrate periphery (a bevel), a pattern may become separated from the semiconductor substrate and may become particles. This is because the pattern is easily peeled off at the bevel. When these particles are re-deposited onto the semiconductor substrate, re-deposition reduces the production yield of semiconductor devices. Consequently, after a thin film is formed over the entire region of the surface in the semiconductor substrate, treatment is performed to remove unnecessary portions of the thin film, i.e., the thin film formed at the bevel.

A method of removing film by polishing the bevel with CMP (Chemical Mechanical Polishing) and another method to clean the bevel using wet etching are mainly used for bevel etching apparatuses (reference is made, for example, to Publication of Japanese Patent Application Laid-Open No. 2002-9059).

SUMMARY OF THE INVENTION

However, in the method of performing the bevel etching with CMP, not only the film, which should be removed, but the semiconductor substrate also is polished. Consequently, there is the problem that the shape in the area of the bevel in the semiconductor substrate may change. Further, although etching of the bevel at the front surface side where a polishing pad comes into contact is easy in this method, there is the problem that it is difficult to simultaneously etch the rear surface and the edge of the substrate.

Similar to the method of bevel etching with wet etching, as well; even though it is easy to perform etching of the bevel at the front surface side, there is the problem that it is difficult to simultaneously perform the etching on the rear surface and at the edge of the substrate. Simultaneously etching the bevel, the rear surface and the edge of the substrate, the apparatus is complicated, with the problem that the bevel etching apparatus becomes expensive.

The present invention has been proposed by taking the conventional circumstances into consideration, and has as its objective is to provide a bevel etching apparatus and a bevel etching method to facilitate bevel etching without deforming a substrate with comparatively simple construction.

In order to achieve the aforementioned objective, the following means is adopted in the present invention. In other words, the bevel etching apparatus relating to the present invention is provided with a support unit applied ground potential. The support unit rotates a substrate supported thereon along the circumferential direction. A region (a bevel) with a predetermined distance from the outer edge of the substrate supported by the support unit is inserted into a gap established in an electrode. In the electrode, the surface opposing to the substrate is covered with a dielectric, concurrently connecting a high-frequency power source or a pulse power source.

According to this construction, applying high-frequency electric power in the state that the bevel of the substrate is inserted into the gap of the electrode generates atmospheric-pressure plasma between the electrode and the substrate. The circumferential rotation of the substrate in the state around enables simultaneous etching of the front surface, the rear surface and the side of the substrate without causing any configuration change in the substrate.

In the construction, the electrode may be comprised a front surface side electrode at a front surface side of the inserted substrate and a rear surface side electrode at a rear surface side of the inserted substrate, which are electrically separated. In this case, the high-frequency power source is connected to one surface side electrode, and the ground potential is applied to the other surface side electrode. In the present construction, even in a state that no substrate is inserted into the gap of the electrode, the atmospheric-pressure plasma can be stably generated at the gap (between the front surface side electrode and the rear surface side electrode). Consequently, two or more substrates can be continuously processed where the plasma is generated.

The construction may be further provided with a unit to supply gas to the gap of the electrode and a unit to discharge the gas. For example, supplying inert gas or fluorocarbon gas from the gas supply unit enables easy etching even if the subject to be etched is a difficult material to etch.

It is preferable that the aforementioned support unit or electrode be movably arranged in parallel to the supported substrate. Further, the bevel etching apparatus may be provided with a unit to detect the etching behavior of the substrate inserted into the gap.

From another perspective, the present invention provides a bevel etching method for etching a region at a predetermined distance from the outer edge of a substrate. In the bevel etching method relating to the present invention, first, a substrate is inserted into a gap of an electrode which has the gap inserted a region at a predetermined distance from the outer edge of the substrate and a surface opposing to the inserted substrate is covered with a dielectric. Next, high-frequency electrode power is applied to the electrode to generate an atmospheric-pressure glow discharge between the electrode and the inserted substrate. And then, the substrate is rotated in the condition that the periphery of the substrate is inserted into the gap.

According to this construction, bevel etching can be simultaneously performed on the front surface, the rear surface and the side of the substrate without causing any configuration change in the substrate.

In the aforementioned construction, it is preferable to extract the substrate from the gap and to stop the application of the high-frequency electric power after extracting the substrate. This can prevent re-deposition of the attachment removed from the substrate to the substrate.

In addition, an etching end point may be detected by detecting the etching behavior of the substrate inserted into the gap.

According to the present invention, the bevel etching can be simultaneously performed on the front surface, the rear surface and the side of the substrate without causing any configuration change in the substrate. Consequently, throughput of the bevel etching is improved, and production costs can be reduced. Further, since bevel etching is performed with the bevel etching apparatus of the present invention using atmospheric-pressure glow discharge, a vacuum system becomes unnecessary. Consequently, the apparatus can be constructed at a low cost. In addition, because the attachment removed from the substrate can be captured to the atmospheric-pressure plasma, the re-deposition of the particles onto the surface of the substrate can be remarkably reduced. As a result, the production yield of semiconductor devices can be further improved.

The foregoing and other objects, features, aspects and advantages of the present invention will become more apparent from the following detailed description of the present invention when taken in conjunction with the accompanying drawings.

DETAILED DESCRIPTION OF PREFERRED EMBODIMENTS

The bevel etching apparatus and the bevel etching method relating to embodiments of the present invention are described hereafter, with reference to the drawings.

First Embodiment

Figure 1:
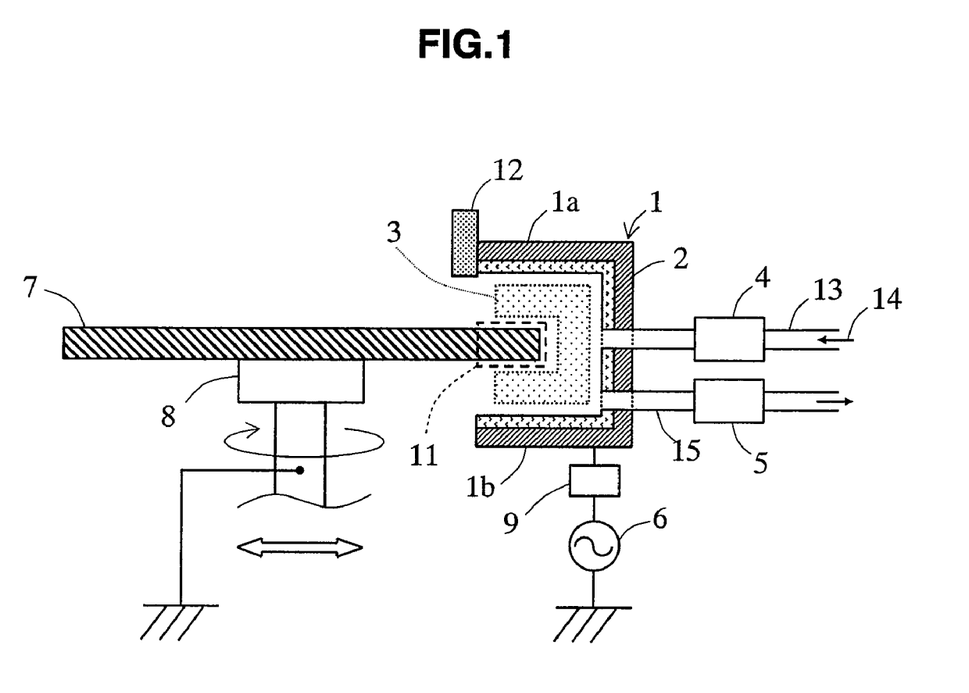
FIG. 1 is a schematic view showing a bevel etching apparatus relating to the first embodiment of the present invention.

FIG. 1 is a schematic view of a bevel etching apparatus relating to the first embodiment of the present invention. As shown in FIG. 1, the bevel etching apparatus of the present embodiment is provided with a wafer chuck 8 (a support unit) for supporting a semiconductor substrate 7 (hereafter, referred to as a wafer 7). The wafer chuck 8 is made from a conductor material, such as metal, and ground potential is applied. Further, a surface of the wafer chuck 8 for the placement of the wafer 7 has a diameter which is smaller than that of the wafer 7. A vacuum chuck or an electrostatic chuck is arranged on the contract surface of the wafer chuck 8, and the wafer 7 is attached and secured. Further, the wafer chuck 8 is constructed to be rotatable along the circumferential direction of the wafer 7, by an un-shown drive mechanism.

Further, the present bevel etching apparatus is provided with an electrode 1 to etch a bevel 11 in the wafer 7 supported by the wafer chuck 8, in which the bevel 11 indicates the periphery at the front surface side, the periphery at the rear surface side and the edge of the substrate. The electrode 1 is composed of a front surface side electrode 1a arranged at the front surface side of the wafer 7 supported by the wafer chuck 8 at a predetermined interval from the wafer 7, and a rear surface side electrode 1b arranged at the rear surface side of the wafer 7 at a predetermined interval from the wafer 7. The front surface side electrode 1a and the rear surface side electrode 1b are connected, the cross section of the electrode 1 being a U-type shape (horseshoe shape).

A high-frequency power source 6 is connected to the electrode 1 via a matching network 9. The high-frequency power source 6 applies a high-frequency electric power of several hundreds of kHz to the electrode 1. The application of the high-frequency electric power causes the generation of an atmospheric-pressure plasma 3 due to atmospheric-pressure glow discharge between the wafer 7, which is inserted between the front surface side electrode 1a and the rear surface side electrode 1b (hereafter, referred to as a gap of the electrode 1), and the electrode 1. Furthermore, the inner wall of the electrode 1 (the surface opposing to the wafer 7) is covered with a dielectric 2 made from, such as a film formed by plasma spraying or ceramic liner. This dielectric 2 is required for maintaining the glow discharge. Without the dielectric 2, the glow discharge transits to the arc discharge, and then, a defect, such as dissolution of wafer, occurs. Further, in the case that only the establishment of the dielectric 2 may cause transition of the discharge to an arc discharge, switching the high-frequency power source 6 ON and OFF and intermittent supply of the high-frequency electric power to the electrode 1 enable the maintenance of the glow discharge.

Further, a gas supply port is arranged in the inner wall of the electrode 1. The gas supply port is connected to a gas supply pipe 13 (gas supply unit), which is connected to an un-shown gas supply system. The gas supply pipe 13 is intervened with a flow rate meter 4, and gas 14 whose flow rate is controlled is supplied to the gap of the electrode 1. Further, a gas exhaust port is arranged in the inner wall of the electrode 1. The gas exhaust port is connected to a gas exhaust pipe 15, which is connected to a pump 5. Then, the pressure within the gas exhaust pipe 15 is maintained at lower than atmospheric pressure. In FIG. 1, a gas pipe is shown, but it is acceptable some gas pipes are established.

The wafer 7 placed on the wafer chuck 8 is grounded via the wafer chuck 8, which enables stabilization of the potential distribution in the vicinity of the wafer 7. In this case, self-bias from several tens volts to several hundreds volts are applied to the wafer 7. The magnitude of the self-bias can be controlled by changing the wafer chuck capacity or the capacity between the wafer chuck 8 and the earth. When the plasma 3 is generated, since electronic current flows into the bevel 11 from the plasma 3, the wafer 7 becomes a negative potential. Consequently, positive ions enter the bevel 11 of the wafer 7 from the plasma 3, etching an attachment (film) of the bevel 11. Since the plasma 3 is atmospheric-pressure plasma, the positive ions entering the wafer 7 are mainly oxygen ions or nitrogen ions. A reaction product or sputtered substance after etching is discharged to the outside through the exhaust pipe 15. Furthermore, when the attachment, which is the subject to be etched, is a material that is difficult to be etched by atmospheric-pressure plasma; an inert gas, such as argon or xenon, or fluorocarbon gas, such as $CF_4$, can be supplied via the gas supply pipe 13 according to the material type of the subject to be etched.

Further, in the bevel etching apparatus of the present embodiment, in order to enable adjustment of the insertion width of the wafer 7 into the gap of the electrode 1, the wafer chuck 8 is constructed to be movable along the horizontal direction. In addition, a sensor 12, such as a photo interrupter, for detecting the position of the edge (outer end) of the wafer 7 is arranged at the end of the front surface side electrode 1a. In other words, while the wafer moves horizontally, after the sensor 12 detects the wafer edge, if the wafer 7 can be horizontally moved toward the electrode 1 only for a predetermined time period (or at a predetermined distance) equivalent to the bevel 11, the wafer 7 can always be inserted by a certain distance (for example, 5 mm from the wafer edge) between the front surface side electrode 1a and the rear surface side electrode 1b. Needless to say, a construction where the electrode 1 is horizontally movable can be adopted, instead of the wafer chuck 8.

In the present embodiment, the electrode 1 is arranged over the width of a portion of the external circumference of the wafer 7. Etching the bevel 11 around the wafer 7 can be performed by rotating the wafer 7 using an un-shown drive mechanism in the state in which plasma 3 is generated. Since the etching speed of the plasma 3, which is the atmospheric-pressure plasma, is fast, it is possible that the rotation rate of the wafer 7 on the occasion of the bevel etching be 10 rpm or faster. Further, in the present embodiment, the etching speed is faster and no vacuum time is necessary because of using the atmospheric-pressure plasma. Consequently, according to the bevel etching apparatus of the present embodiment, the throughput of the bevel etching processing can be improved.

Figure 2:
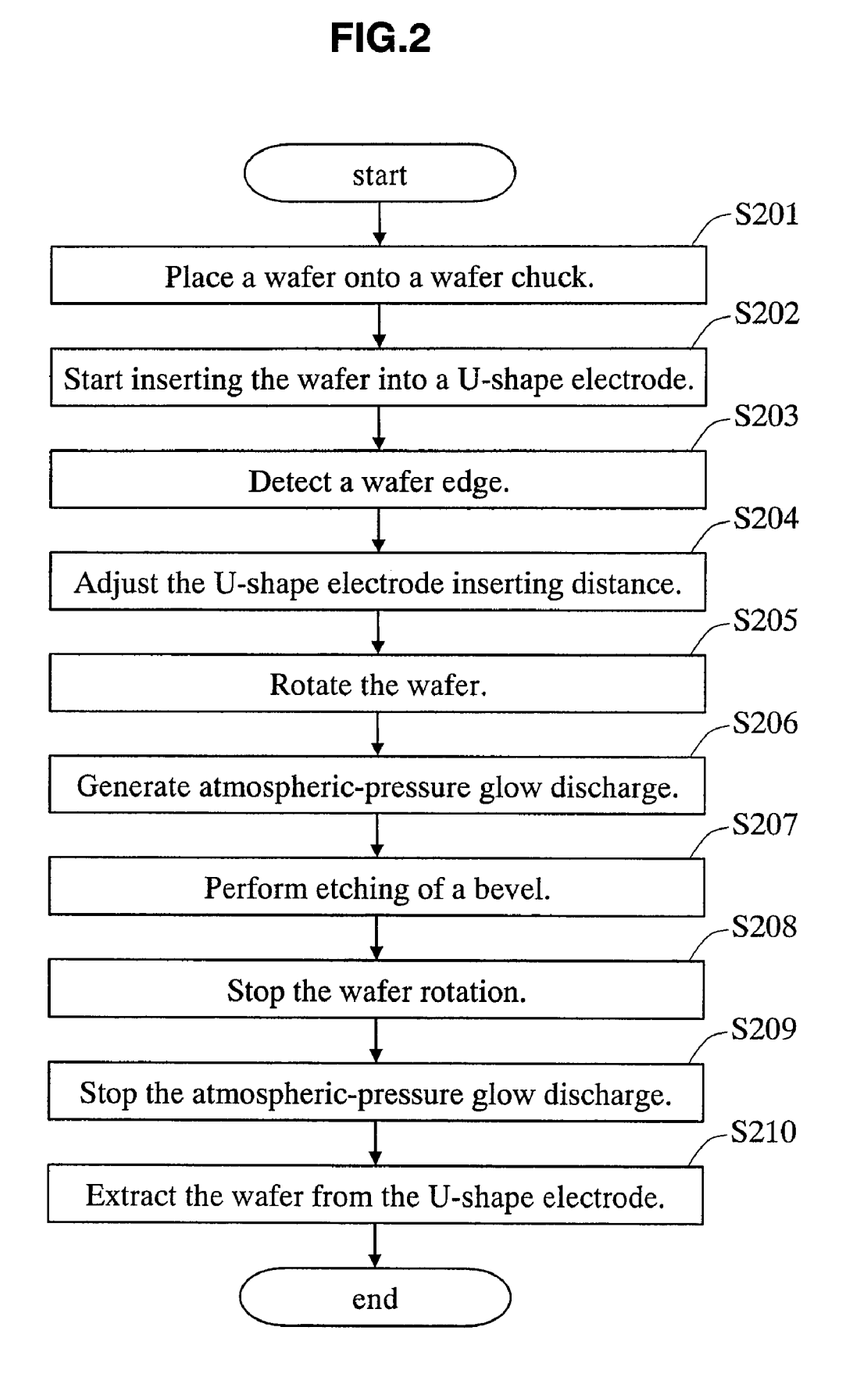
FIG. 2 is a flowchart showing a bevel etching process relating to the first embodiment of the present invention.

Subsequently, procedures when conducting bevel etching in the bevel etching apparatus are described. FIG. 2 is a flowchart showing the process of bevel etching performed with the bevel etching apparatus according to the present embodiment.

First, the wafer 7 is placed onto the wafer chuck 8 (S201). Next, when the wafer placement is detected by the sensor arranged in the wafer chuck 8, the wafer 7 horizontally moves toward the electrode 1, and the wafer 7 is inserted between the front surface side electrode 1a and the rear surface side electrode 1b (S202). During this process, the wafer edge is detected by the sensor 12 (S203), and adjustment of the horizontally moving distance of the wafer chuck 8 thereafter enables the insertion of only the bevel 11 between the electrodes (S204). When insertion is complete, the wafer chuck 8 starts rotating at the predetermined speed (S205). Once the rotation of the wafer chuck 8 starts, high-frequency electric power is applied to the electrode 1 by the high-frequency power source 6, and the atmospheric-pressure plasma is generated (S206). The bevel 11 is etched by maintaining this state at a predetermined rate of rotation (predetermined time period) (S207). At this time, if it is difficult to etch the attachment of the bevel 11, helium gas or argon gas, or fluorocarbon gas, such as $CF_4$, is supplied from the gas supply pipe 13 at the several tens ml/min (standard condition) of flow rate, and etching is performed.

When the rotation of the wafer chuck 8 has achieved the predetermined number of rotations (predetermined time period), the rotation of the wafer chuck 8 is stopped (S208). After this, the application of the high-frequency electric power to the electrode 1 is stopped (S209), and the processed wafer 7 is extracted from between the electrodes after the plasma 3 disappears (S210). The processed wafer 7 is extracted to the outside of the bevel etching apparatus.

As explained above, according to the present embodiment, the wafer periphery at the front surface side, the wafer periphery at the rear surface side and the wafer edge can be simultaneously etched without causing any configuration change in the wafer. Consequently, in comparison with the prior art, the throughput of the bevel etching processing can be improved, and production cost can be reduced. Further, in the present embodiment, no vacuum system for etching is necessary by utilizing the atmospheric-pressure glow discharge, and the construction can be simplified in comparison to the prior art. Therefore, the bevel etching apparatus can be manufactured at comparatively low cost, and production costs can be reduced. Further, re-deposition of particles generated due to the detachment of the attachment of the bevel, onto the wafer surface can be prevented by using the bevel etching apparatus of the present embodiment, and the production yield of the semiconductor devices can be improved.

Furthermore, in the flowchart of FIG. 2, the order of the step to adjust the U-shape electrode insertion distance (S204) and the step to start rotating the wafer chuck 8 (S205) may be reversed. Regarding the step to stop the rotation of the wafer chuck 8 (S208) and the step to stop the application of the high-frequency electric power (S209), if the order is reversed or they are performed simultaneously, a similar effect can be obtained.

Second Embodiment

Figure 3:
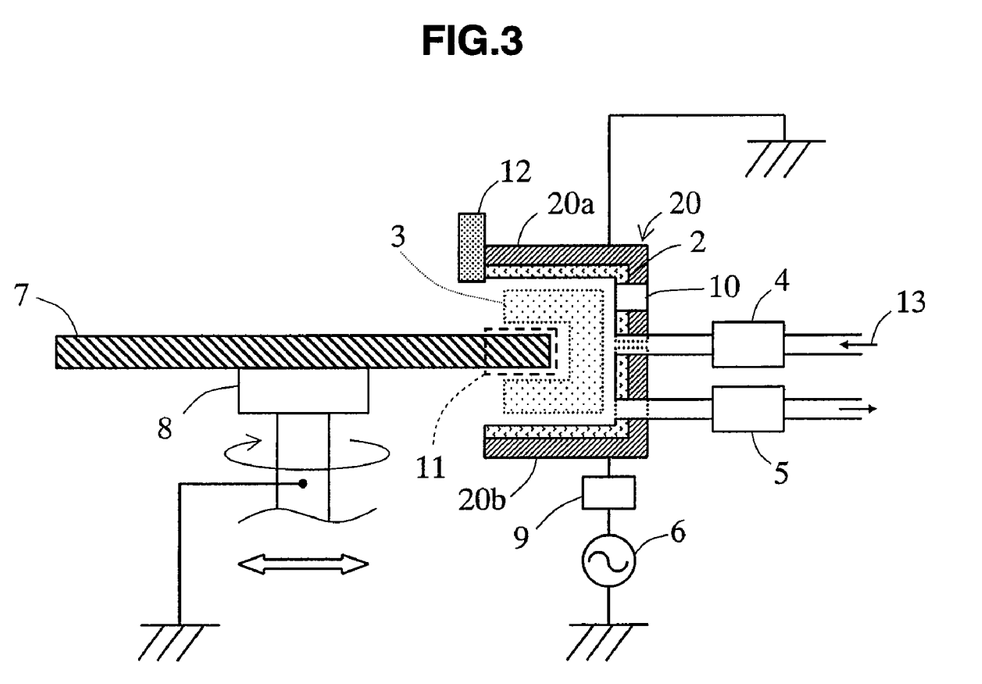
FIG. 3 is a schematic view showing a bevel etching apparatus relating to the second embodiment of the present invention.

Next, the bevel etching apparatus relating to the Second Embodiment of the present invention is described. FIG. 3 is a schematic view of the bevel etching apparatus relating to the second embodiment of the present invention. The bevel etching of the present embodiment is provided with an electrode 20, which is electrically separated into a front surface side electrode 20a and a rear surface side electrode 20b, instead of the electrode 1 as in the first embodiment. The cross section of the front surface side electrode 20a and the rear surface side electrode 20b is L-shaped, respectively, and both electrodes are arranged to have a roughly U-shape of cross section together. Further, in the present embodiment, the high-frequency power source 6 is connected to the rear surface side electrode 20b, and the ground potential is applied to the front surface side electrode 20a. Furthermore, the dielectric 2 is arranged in the inner wall of the electrode 20 and on the surface of the divided portion of the electrode 20.

Further, the bevel etching apparatus in the present embodiment is provided with an etching end point detecting unit to detect an etching end point of bevel etching. In the example of FIG. 3, the etching end point detecting unit is composed with a window 10 made from a translucent material established in the electrode 20 and an un-shown spectrometer. In this construction, the plasma luminescence intensity with a specific wavelength is measured by the spectrometer via the window 10, and the etching end point is detected by the detection of the intensity change (etching behavior). Furthermore, for the detection method for the etching end point, any detection method that is used for the end point detection of plasma etching is usable. For example, when a light beam with a specific wavelength is irradiated onto the bevel via the window arranged at the front surface side electrode 20a immediately above the bevel of the wafer 7, the etching end point can be detected by detecting the change of reflected light intensity of the light, as well.

Further, in the present embodiment, since the plasma 3 is generated under atmospheric pressure, it also has a merit that the etching state can be easily observed compared to the processing in a vacuum. For example, the etching end point can be detected even by directly observing the surface condition of the bevel 11 using an optical microscope via the window arranged at the front surface side electrode 20a. Furthermore, since the other configurations are the same as those in the bevel etching apparatus in the first embodiment, the description is omitted.

In the first embodiment, because no ground potential (ground electrode) exists in the vicinity of the electrode 1 in the state that the wafer 7 is not inserted into the gap of the electrode 1, it is possible that the plasma 3 becomes unstable. In the meantime, according to the construction of the present embodiment, even if the wafer 7 is not inserted, the plasma 3 can be stably generated between the front surface side electrode 20a and the rear surface side electrode 20b.

Figure 4:
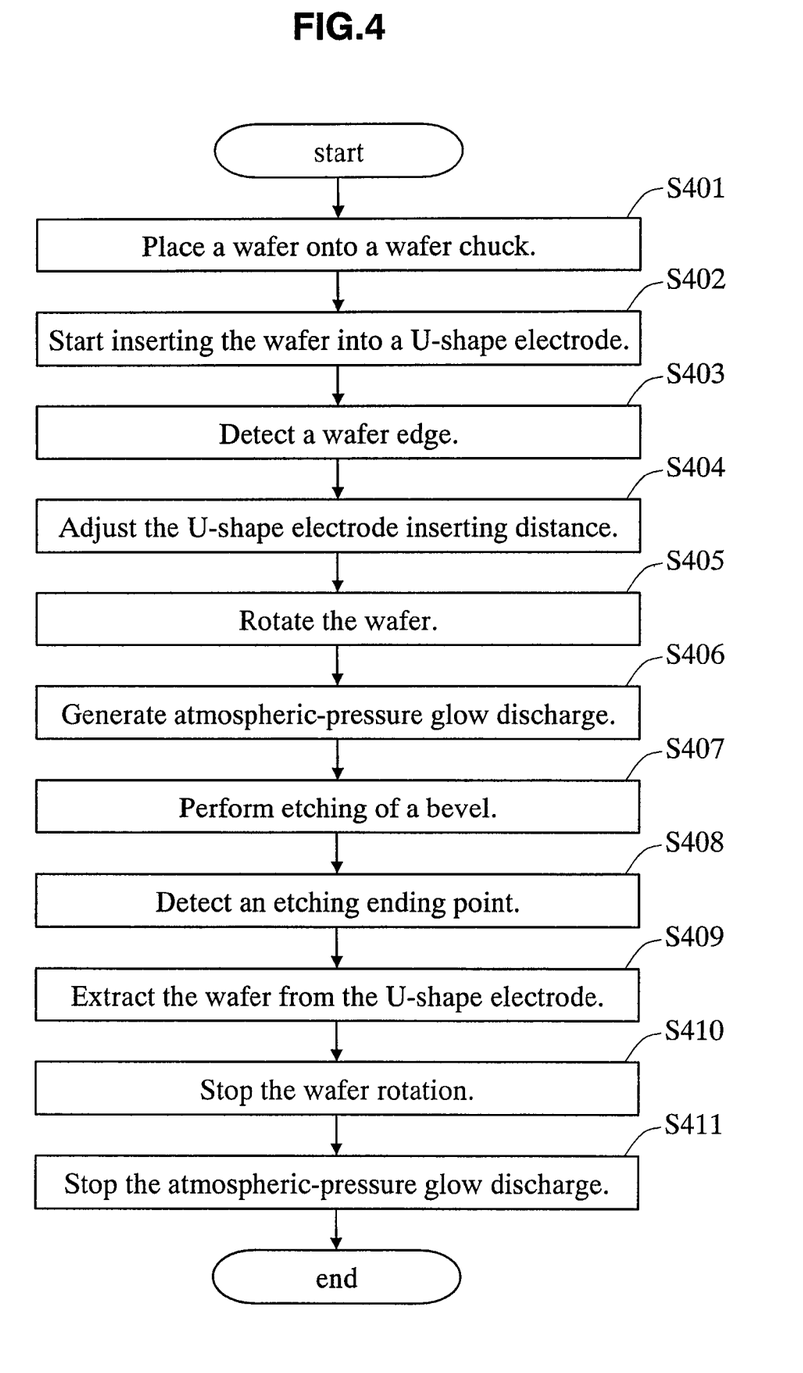
FIG. 4 is a flowchart showing a bevel etching process relating to the second embodiment of the present invention.

Subsequently, in the bevel etching apparatus, procedures on the occasion of performing the bevel etching are described. FIG. 4 is a flowchart showing the process of bevel etching in the bevel etching apparatus of the present embodiment.

First, the wafer 7 is placed onto the wafer chuck 8 (S401). Then, the wafer chuck 8 horizontally moves toward the electrode 1, and the wafer 7 is inserted between the front surface side electrode 20a and the rear surface side electrode 20b (S402). In this process, the wafer edge is detected by the sensor 12 (S403), and only the bevel 11 is inserted between the electrodes by adjusting the horizontally moving distance of the wafer chuck 8 thereafter (S404). When the insertion of the wafer 7 is completed, the rotation of the wafer chuck 8 starts at a predetermined speed (S405). When the rotation of the wafer chuck 8 is started, high-frequency electric power is applied to the electrode 20 (20b) by the high-frequency power source 6, and atmospheric-pressure plasma 3 is generated (S406). The bevel is etched by the maintenance of this condition (S407).

The etching proceeds, and when the etching end point is detected by the etching end point detecting unit (S408), the wafer chuck 8 horizontally moves, and the wafer 7 is extracted from between the front surface side electrode 20a and the rear surface side electrode 20b (S409). When the sensor 12 detects the wafer edge and the extraction of the wafer 7 is completed, the wafer chuck 8 stops rotating (S410). The processed wafer 7 is extracted to outside of the bevel etching apparatus. Subsequently, the application of the high-frequency electric power to the electrode 20 is stopped (S411). At this time, a next wafer 7 can also be successively processed without stopping the application of high-frequency electric power. In this case, since the wafer to be processed next will not require any time to generate the plasma 3, the throughput of the bevel etching process can be improved.

Figure 5:
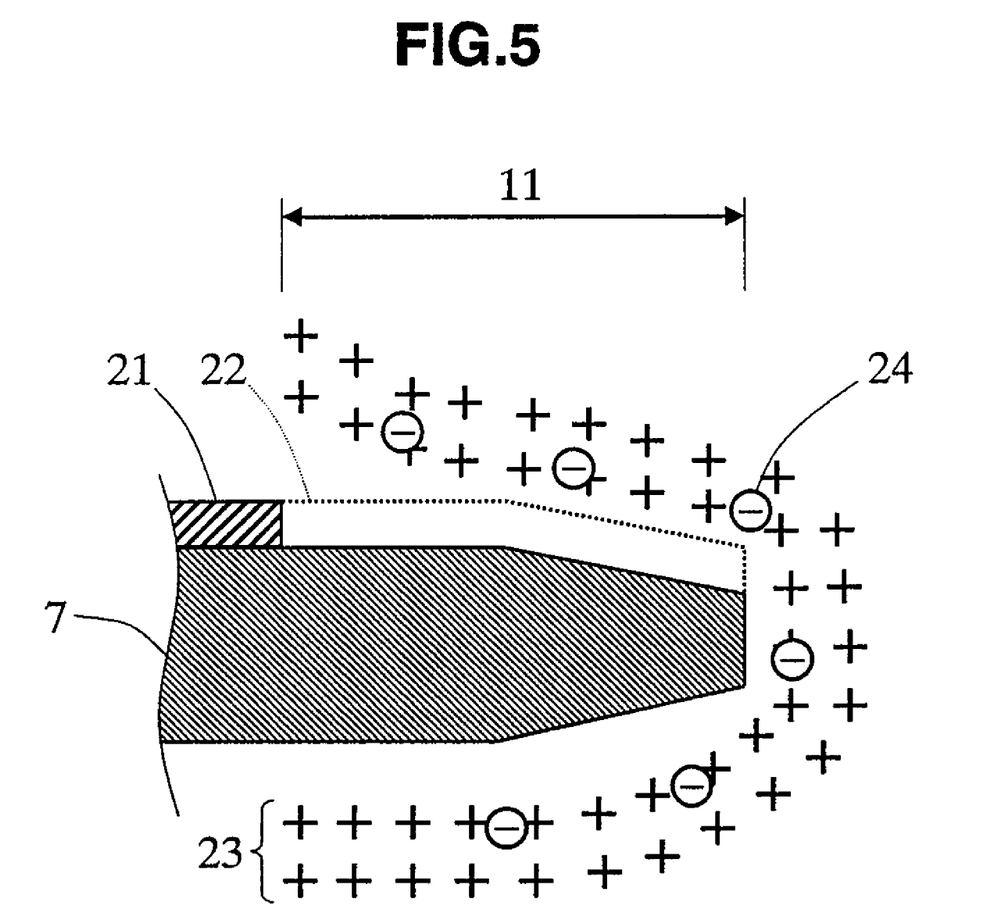
FIG. 5 is a diagram explaining the prevention of particle re-deposition onto the bevel relating to the second embodiment of the present invention.

As described above, in the bevel etching apparatus of the present embodiment, the wafer 7 is extracted from between the electrodes in the condition that the plasma 3 is generated. This can prevent the re-deposition of etched substance (particles) on the bevel 11. FIG. 5 is a diagram for explaining the prevention mechanism of particle re-deposition. Furthermore, in FIG. 5, a film 22 before being removed by etching is indicated by a broken line.

The wafer 7 during the bevel etching processing as described above is biased to the negative potential by the electronic current. Similarly, a film 21 (22) on the wafer 7 is also negatively charged. Further, ion sheath 23 are formed so as to cover the surface of the bevel 11 in the vicinity of the wafer 7 inserted into the plasma. In this state, particles 24, such as reaction products or sputtered substances, to be generated when etching the film 22 by positive ions are also negatively charged. Consequently, the particles 24 are captured by the ion sheath 23, and cannot fall onto the wafer 7. Therefore, the re-deposition of the particles 24 onto the bevel 11 is reduced. In other words, extraction of the processed wafer 7 in the condition that the plasma 3 is generated enables the prevention of the particle re-deposition onto the wafer. Therefore, the extraction of the processed wafer 7 in the state that the plasma 3 is generated enables further improvement of the production yield of the semiconductor devices.

Furthermore, in the flowchart of FIG. 4, the order of the step to detect the wafer edge (S403) and the step to adjust the U-shape electrode insertion distance of the bevel (S404) may be reversed. Further, the step to generate the glow discharge (S406) can provide a similar effect even when performed at any time, as long as it is conducted before the step to perform the etching of the bevel 11 (S407). In addition, the order of the step to stop the rotation of the wafer chuck 8 (S410) and the step to stop the atmospheric-pressure glow discharge (S411) may be reversed. In addition, when it is difficult for the attachment of the bevel 11 to be etched, an inert gas, such as helium gas or argon gas, or fluorocarbon gas, such as $CF_4$, may be supplied at the several tens of ml/min (standard condition) of flow rate from the gas supply pipe 13, and etching is performed.

As described above, according to the present embodiment, in addition to obtaining the similar effect of the first embodiment, the deposition of particles onto the bevel can be extremely minimized. Therefore, the production yield of semiconductor devices can be further improved. Even in a state where the wafer 7 is inserted between the electrodes, because the plasma 3 can be stably generated, it is preferable for consecutive processing of multiple wafers 7.

Furthermore, the embodiments described above are not limited to the technical scope of the present invention, but various modifications and applications are possible within the scope of the present invention other than the described ones. For example, the etching of the bevel was described. However, the present invention is applicable to cleaning the entire surface of the substrate or resist ashing by unifying inserting distance of the substrate into the gap of the electrode and the radius of substrate.

The atmospheric-pressure glow discharge is used in the present invention, and the bevel can be etched at very low cost and at very fast speed. Consequently, the present invention is useful as the bevel etching apparatus and the bevel etching method. Further, the present invention can be applied to the use of a manufacturing method for MEMS (Micro Electro Mechanical Systems) devices or liquid crystal panels.

While the invention has been shown and described in detail, the foregoing description is in all aspects illustrative and not restrictive. It is therefore understood that numerous modifications and variations can be devised without departing from the scope of the invention.

The invention claimed is:

1. A bevel etching apparatus for etching a region of a substrate at a predetermined distance from the outer edge of the substrate, comprising:
    a support unit configured to apply ground potential and rotate the substrate supported thereon along the circumferential direction;
    an electrode having a gap configured for inserting the region of the substrate at the predetermined distance from the outer edge of the supported substrate, wherein the electrode comprises a surface covered with dielectric, and wherein the surface is opposite the substrate region inserted into the gap; and
    a high-frequency power source connected to the electrode, wherein the electrode has a U-shaped type cross section comprising a front surface side electrode located at a front surface side of the inserted substrate and a rear surface side electrode located at a rear surface side of the inserted substrate,
    wherein the front surface side electrode and the rear surface side electrode are electrically connected, the high-frequency power source is connected to the front surface side electrode and the rear surface side electrode, and the inserted substrate is grounded via the support unit.

2. A bevel etching apparatus according to claim 1, further comprising:
    a unit configured to supply gas to the gap of the electrode; and
    a unit exhausting the gas.

3. The bevel etching apparatus according to claim 1, further comprising a sensor configured to detect a position of an edge of the substrate and being arranged at an end of the U-shaped electrode, wherein the support unit or the electrode is arranged to be movable in parallel to the supported substrate.

4. The bevel etching apparatus according to claim 1, further comprising:

a unit configured to detect the etching behavior of the substrate inserted into the gap.

5. The bevel etching apparatus according to claim 1, wherein the dielectric is a ceramic liner.

6. The bevel etching apparatus according to claim 1, wherein the support unit comprises a vacuum chuck for securing the substrate.

* * * * *